US 6,689,638 B2

(12) United States Patent
Lin et al.

(10) Patent No.: US 6,689,638 B2
(45) Date of Patent: Feb. 10, 2004

(54) SUBSTRATE-ON-CHIP PACKAGING PROCESS

(75) Inventors: Chung-Hung Lin, Tainan (TW); Cho-Liang Chung, Fengshan (TW); Jesse Huang, Kaohsiung (TW); Yao-Jung Lee, Tainan (TW)

(73) Assignees: Chipmos Technologies (Bermuda) Ltd., Hsinchu (TW); Chipmos Technologies Inc., Hamilton (BM)

( * ) Notice: Subject to any disclaimer, the term of this patent is extended or adjusted under 35 U.S.C. 154(b) by 61 days.

(21) Appl. No.: 10/227,341

(22) Filed: Aug. 26, 2002

(65) Prior Publication Data

US 2003/0040142 A1 Feb. 27, 2003

(30) Foreign Application Priority Data

Aug. 27, 2001  (TW) ........................................ 90121249 A

(51) Int. Cl.⁷ .......................... H01L 21/44; H01L 21/48; H01L 21/50
(52) U.S. Cl. ....................... 438/118; 438/106; 438/112; 438/119; 438/124; 438/127
(58) Field of Search ................................. 438/108, 112, 438/118, 119, 124, 126, 127, 106

(56) References Cited

U.S. PATENT DOCUMENTS

| 5,840,598 | A | * | 11/1998 | Grigg et al. ................. 438/118 |
| 6,017,776 | A | * | 1/2000 | Jiang et al. .................. 438/118 |
| 6,046,072 | A | * | 4/2000 | Matsuura et al. ........... 438/118 |
| 6,048,755 | A | * | 4/2000 | Jiang et al. .................. 438/118 |
| 6,190,943 | B1 | | 2/2001 | Lee et al. |
| 6,281,044 | B1 | * | 8/2001 | VanNortwick .............. 438/111 |
| 6,297,076 | B1 | * | 10/2001 | Amagai et al. ............. 438/114 |
| 6,300,165 | B2 | * | 10/2001 | Castro ......................... 438/118 |

* cited by examiner

Primary Examiner—John F. Niebling
Assistant Examiner—Angel Roman

(57) ABSTRACT

A SOC (Substrate-On-Chip) packaging process is disclosed. A layer of two-stage thermosetting mixture with solvent is coating on an upside of a substrate. Thereafter, the substrate is heated for removing solvent so that the two-stage thermosetting mixture becomes a B-stage dry adhesive film without solvent. Thus, the bonding pads of the chip are not covered by the dry adhesive film and a better operating flexibility is obtained in the SOC packaging process.

7 Claims, 3 Drawing Sheets

SUBSTRATE-ON-CHIP PACKAGING PROCESS

FIELD OF THE INVENTION

The present invention relates to a semiconductor packaging process, and more particularly to a SOC (Substrate On Chip) packaging process.

BACKGROUND OF THE INVENTION

The so-called "SOC packaging", which is Substrate-On-Chip packaging for short, is referred to a semiconductor packaging structure in common use. Semiconductor chips are attached on a substrate with holes, and a plurality of metal bonding wires connect the substrate with the chips via the holes. Normally the substrate is also formed with a plurality of solder balls in a grid array. In the U.S. Pat. No. 6,190,943 entitled "CHIP SCALE PACKAGING METHOD", a SOC package structure and a packaging method are disclosed. As shown in FIG. 1, the SOC package 20 comprises a wiring substrate 22, a semiconductor chip 24, and a plurality of spherical bonding balls 44. The substrate 22 has an upper surface 30 for attaching the chip 24, an underside 38 with the spherical bonding balls 44 implanted therein, and through holes 34 passing through the upper surface 30 and the underside 38. Wherein the chip 24 is attached to the upper surface 30 of the substrate 22 by a thermoplastic adhesive layer 28. The through holes 34 of substrate 22 expose the bonding pads 36 of the active surface 26 on chip 24 so that the bonding wires 32 may connect the bonding pads 36 of the chip 24 and the conductive area 41 of substrate 22 via the through holes 34. The conductive area 41 is provided with a conductive layer 40 formed on the underside 38 of substrate 22. The fringe of the chip 24, and each of the through holes 34 of substrate 22 are protected by a passivation layer 42 of a non-conducting resin material.

As shown in FIG. 2, the method for making the SOC package structure 20 disclosed in the U.S. Pat. No. 6,190,943 entitled "CHIP SCALE PACKAGING METHOD" comprises the steps of: (a) providing a substrate 22 with an upper surface 30 which is provided with at least one chip-implanting area 302 including the through holes 34 mentioned above; (b) coating a thermoplastic adhesive layer 28 on the chip-implanting areas 302 by stenciling; (c) implanting chips 24 in the area 302 such that the active surfaces 26 are in contact with the thermoplastic adhesive layer 28, and that the bonding pads 36 are corresponding in location to the through holes 34; (d) heating the substrate 22 and the chips 24 under pressure for a predetermined period of time; (e) forming the bonding wires 32 connecting the conductive area 41 of the substrate 22 with the bonding pads 36 of the chips 24 by wire-bonding via the through holes 34; (f) providing a passivation layer 42 on the fringe of the chip 24 and the through holes 34; (g) implanting a plurality of bonding balls 44 in a grid array on the underside 38 of the substrate 22. The SOC package structure 20 is therefore completed by following the above-mentioned steps. The thermoplastic adhesive layer 28 mentioned in step (b) is an elastic, semi-liquid, solvent-free thermoplastic silicon rubber. Because it is semi-liquid before attachment, therefore the heating and pressuring conducted the thermoplastic adhesive layer 28 in step (d) is easy to overflow and thus cover the bonding pads 36 of the chip 24, causing failure in packaging. It is still another disadvantage that after coating of the thermoplastic adhesive layer 28 in step (b), it is unable to pile the substrates 22 for delivery or storage. It has to have the thermoplastic adhesive layer 28 attach to the chips 24 as soon as possible, otherwise, the substrates 22 will be contaminated and adhere to each other, causing difficulties in manufacture.

SUMMARY OF THE INVENTION

A main purpose of the present invention is to supply a SOC packaging process, utilizing a layer of two-stage thermosetting mixture with solvent coating on an upside of a substrate for chip-attachment. After the substrate is heated for removing solvent, the two-stage thermosetting mixture becomes a dry adhesive film without solvent. Thus, the bonding pads of the chip are not covered by the dry adhesive film and a better manufacture quality is obtained in the SOC packaging process.

A second purpose of the present invention is to supply a SOC packaging process, utilizing a layer of two-stage thermosetting mixture with solvent coating on an upside of a substrate for chips attachment. After the substrate is heated for removing solvent, the two stage thermosetting mixture becomes a dry adhesive film without solvent. Thus, the substrates with dry adhesive films are able to pile for delivery or storage, and a better operating flexibility is attained in the SOC packaging process.

The SOC packaging process in accordance with the present invention comprises a first step in which a substrate is provided with an upper surface, an underside surface, and openings which connect the both. Thereafter, the upper surface of the substrate is coating with a two-stage thermosetting mixture with solvent by stenciling or printing. The thermosetting mixture with solvent is subsequently heated and to become a dry adhesive film. Then, at least a chip is provided with an active surface and a plurality of bonding pads disposed on it. Wherein the active surface is in contact with the upper surface of the substrate, and the bonding pads of the chip are corresponding in location to the openings of the substrate. Thereafter, the substrate and chip are heated under pressure to solidify the dry adhesive film so that the chip is securely attached to the substrate. Then the bonding pads of the chip are electrically connected to the substrate by wire-bonding via the openings. Finally, an encapsulating material is provided on the openings of the substrate and, if necessary, a plurality of bonding balls could be implanted on the underside of the substrate to comprise the SOC packaging process.

DETAIL DESCRIPTION OF THE INVENTION

Please refer to the drawings attached, the present invention will be described by means of an embodiment below.

Figure 1:
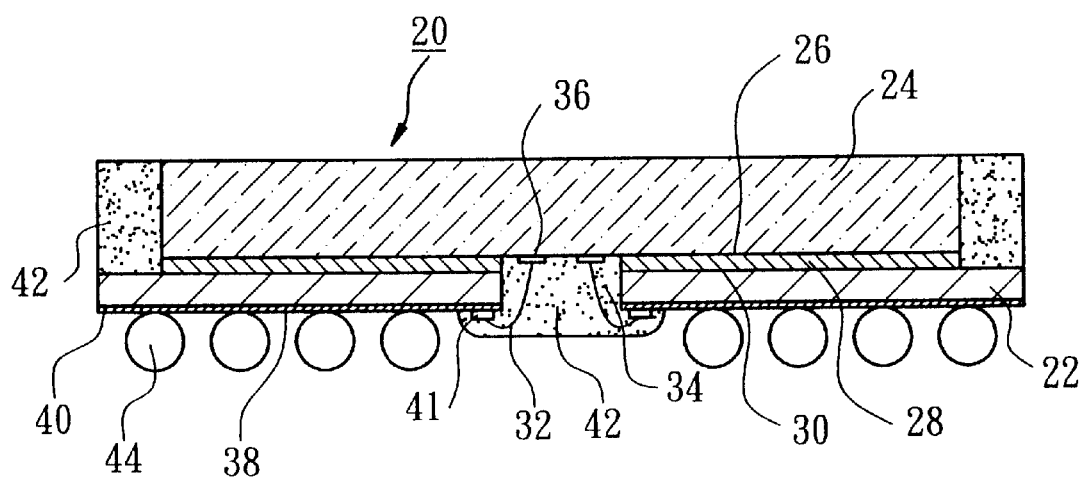
FIG. 1 is a sectional view of a SOC package structure according to the U.S. Pat. No. 6,190,943 entitled "CHIP SCALE PACKAGING METHOD"
Figure 2:
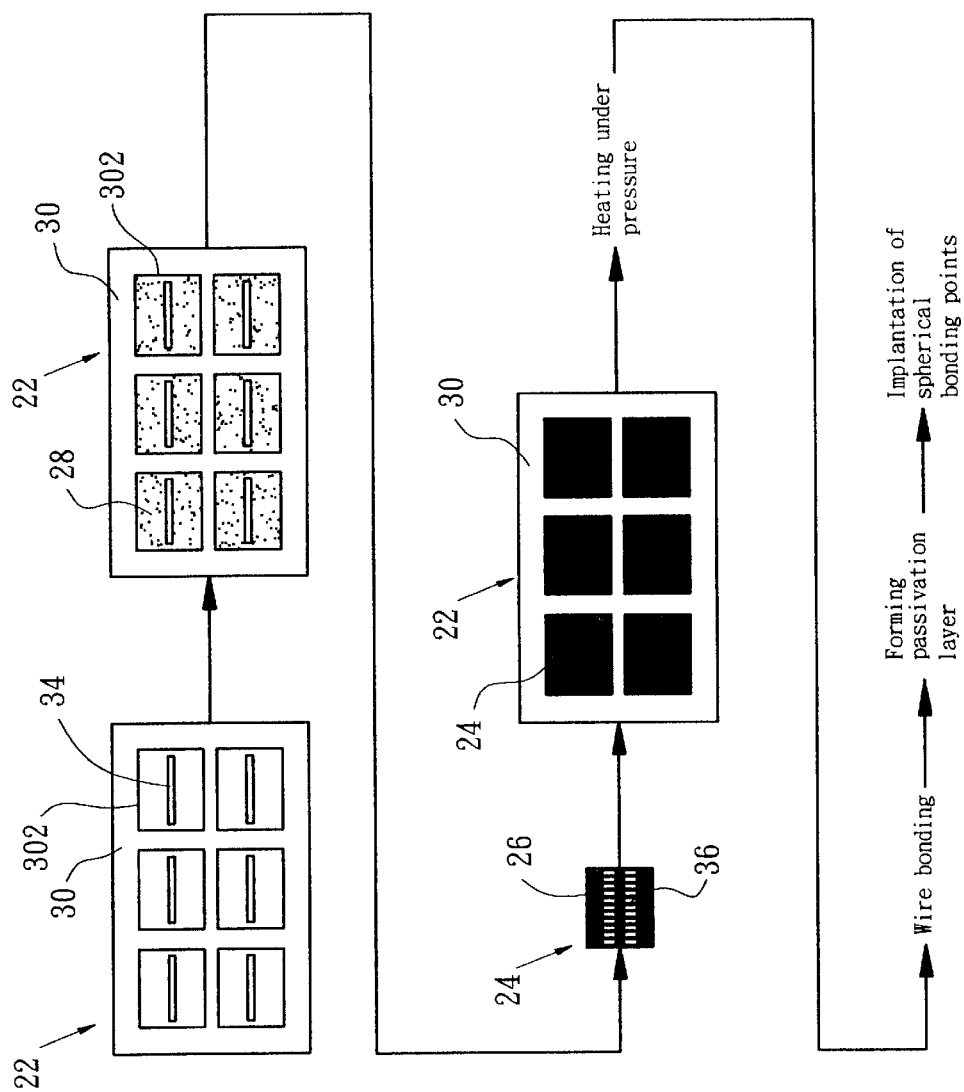
FIG. 2 is a process flow diagram for making the SOC package structure in accordance with the U.S. Pat. No. 6,190,943 entitled "CHIP SCALE PACKAGING METHOD"
Figure 3:
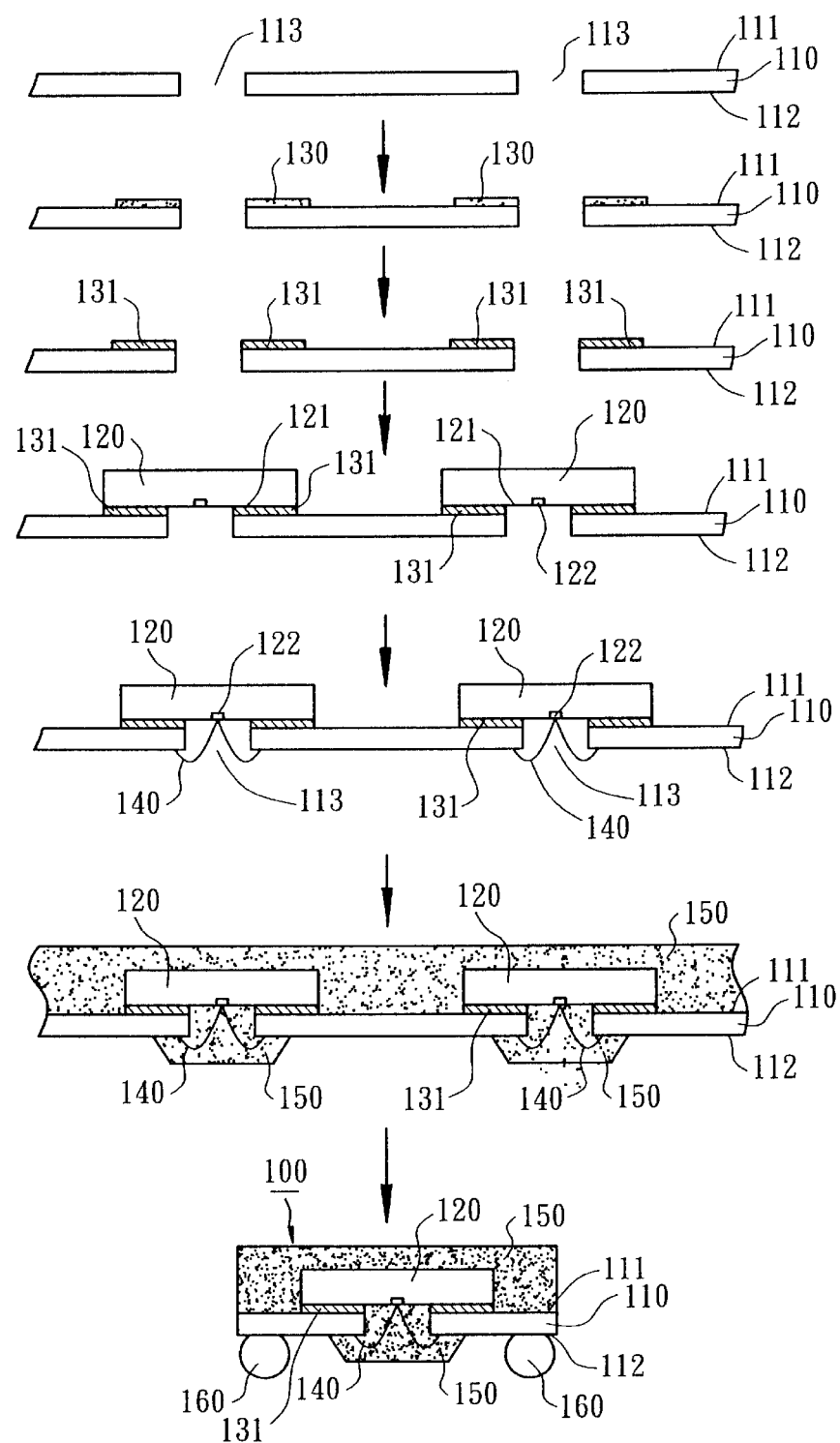
FIG. 3 is a process flow diagram of the SOC packaging method in accordance with the embodiment of the present invention.

As shown in FIG. 3, the embodiment in accordance with the present invention comprises a first step in which a substrate 110 is provided with an upper surface 111, an underside 112, and openings 113 which connects the both. In this embodiment, the substrate 110 is a printed wiring board [such as FR-4, FR-5, BT, and the like having glass fiber reinforced resin]. The underside 112 of the substrate 110 is formed with a circuit pattern [not shown in figure], such as conductive pads, bonding ball pads, and the metal circuits which connect the conductive pads with the bonding ball pads. Thereafter, a layer of "two-stage thermosetting mixture with solvent" 130 is coated on the upper surface 111 of the substrate 110. The "two-stage thermosetting mixture with solvent" 130 comprises thermosetting resin and solvent which could dissolve the thermosetting resin. The thermosetting resin includes a material selected from polyimide, polyquinolin, benzocyclobutene, and the like, and the solvent which dissolve the thermosetting resin includes the one such as 1,3,5-mesitylene or the mixture of butyrolactone and cyclopentanone. The two-stage thermosetting mixture with solvent has the A-stage characteristic while coating on the substrate 110. While coating the mixture 130 is in liquid or glue phase and so it is easy to spread on the upper surface 111 of the substrate 110, therefore it could be formed on the upper surface 111 of the substrate 110 not only by stenciling, but also by painting, printing, spraying, spin-coating, or dipping. Thereafter, the substrate 110 is heated at a predetermined degree [around 90 to 150 degrees in Celsius] to remove the solvent from the mixture 130, and the thermosetting mixture 130 becomes a dry adhesive film 131. It is preferable to conduct another vacuum drying to totally remove the solvent. At this time, the dry adhesive film 131 on the substrate 110 has the B-stage characteristic. Preferably, the dry adhesive film 131 has a glass transition temperature (Tg) more than 40° C., that is, the dry adhesive film 131 doesn't have adhesion in room temperature. Therefore, the substrates 110 are able to pile for delivery or storage. This advantage will help to obtain a better operation flexibility in the SOC packaging process. At least a chip 120 is provided subsequently with an active surface 121 and a plurality of bonding pads 122 on the active surface 121. Wherein the active surface 121 of chip 120 is in contact with the upper surface 111 of substrate 110, and the bonding pads 122 are corresponding in location to the openings 113 of substrate 110. In this embodiment, the bonding pads 122 locate on the center position of the active surface 121 of chip 120. Thereafter, the substrate 110 and chip 120 are heated at 180 degrees in Celsius under pressure for few seconds so that the dry adhesive film 131 becomes adhesive to securely combine the chip 120 and the substrate 110 prior to curing the dry adhesive film 131. The dry adhesive film 131 is not easy to float while heating the chip 120 and substrate 110, therefore, it will not be extruded to cover the bonding pads 122 of the chip 120. The bonding pads 122 of chip 120 are then electrically connect to the substrate 110 with metal bonding wires 140 by wire-bonding via the openings 113. Finally, a thermosetting encapsulating material 150 is provided on the openings 113 of substrate 110. In this embodiment, the encapsulating material 150 is formed by molding. The encapsulating material 150 seals chip 120, and if desired, a plurality of bonding balls 160 could be implanted on the underside 120 of the substrate 110. After dicing the substrate 110, it will form to be a plurality of SOC package structures 100.

It is therefore the primary objective of the present invention to provide the SOC packaging process making use of a layer of "two-stage thermosetting mixture with solvent" 130, as an adhesive film for the substrate 110 and chip 120 so as to avoid the deficiency of fluid viscose covering the bonding pads 122 of chip 120. This also increase the SOC packaging efficiency, and the substrates 110 with dry adhesive films from the mixture 130 are able to pile for delivery or storage, i.e., a better operation flexibility is attained in the SOC packaging process.

The above description of embodiments of this invention is intended to be illustrative and not limiting. Other embodiments of this invention will be obvious to those skilled in the art in view of the above disclosure.

What is claimed is:

1. A semiconductor packaging process comprises the steps of:
   (a) providing a wiring substrate with an upper surface, an underside, and at least an opening which connect the both;
   (b) printing the upper surface of the wiring substrate with a layer of two-stage thermosetting mixture with solvent;
   (c) removing the solvent from the thermosetting mixture so that the thermosetting mixture becomes a B-stage dry adhesive film having a glass transition temperature higher than 40° C.;
   (d) providing at least a chip with an active surface and a plurality of bonding pads on the active surface, wherein the active surface of the chip is in contact with the upper surface of the substrate and the bonding pads of the chip are corresponding in location to the opening of the substrate;
   (e) heating and pressuring the substrate and chip such that the dry adhesive film combines the chip and the substrate without fully-curing the dry adhesive film;
   (f) wire-bonding the substrate and the chip with metal bonding wires connecting the substrate with the bonding pads of the chip via opening; and
   (g) forming an encapsulating material in the opening of the substrate.

2. The semiconductor packaging process according to claim 1, further comprising a step of implanting a plurality of bonding balls on the underside of the substrate after the step (g) of forming the encapsulating material.

3. The semiconductor packaging process according to claim 1, wherein the encapsulating material is formed by molding.

4. The semiconductor packaging process according to claim 1, wherein the encapsulating material seals the chips.

5. The semiconductor packaging process according to claim 1, wherein the solvent from the mixture is removed by heating or vacuum drying.

6. The semiconductor packaging process according to claim 1, wherein the temperature of heating under pressure in step (e) is higher than that in step (c).

7. The semiconductor packaging process according to claim 1, wherein the step (e) includes the step of heating the chip and the substrate to about 180° C. under pressure for a few seconds so that the dry adhesive film becomes adhesive to securely combine the chip and the substrate prior to curing the dry adhesive film.

* * * * *

UNITED STATES PATENT AND TRADEMARK OFFICE
CERTIFICATE OF CORRECTION

PATENT NO. : 6,689,638 B2
DATED : February 10, 2004
INVENTOR(S) : Chung-Hung Lin et al.

It is certified that error appears in the above-identified patent and that said Letters Patent is hereby corrected as shown below:

<u>Title page,</u>
Item [73], Assignees, should read as follows:
-- [73] Assignees: Chipmos Technologies (Bermuda) Ltd., Hamilton (BM)
                                 Chipmos Technologies Inc., Hsinchu (TW) --

Signed and Sealed this

Twenty-fifth Day of May, 2004

JON W. DUDAS
*Acting Director of the United States Patent and Trademark Office*